(12) United States Patent
Xia et al.

(10) Patent No.: US 12,142,610 B2
(45) Date of Patent: Nov. 12, 2024

(54) METHOD OF MANUFACTURING THIN FILM TRANSISTOR AND DISPLAY DEVICE

(71) Applicants: HKC CORPORATION LIMITED, Shenzhen (CN); CHUZHOU HKC OPTOELECTRONICS TECHNOLOGY CO., LTD., Chuzhou (CN)

(72) Inventors: Yuming Xia, Chongqing (CN); En-Tsung Cho, Chongqing (CN); Wanfei Yong, Chongqing (CN)

(73) Assignees: HKC CORPORATION LIMITED, Shenzhen (CN); CHUZHOU HKC OPTOELECTRONICS TECHNOLOGY CO., LTD., Chuzhou (CN)

( * ) Notice: Subject to any disclaimer, the term of this patent is extended or adjusted under 35 U.S.C. 154(b) by 434 days.

(21) Appl. No.: 17/622,715

(22) PCT Filed: Jun. 24, 2020

(86) PCT No.: PCT/CN2020/097842
§ 371 (c)(1),
(2) Date: Dec. 24, 2021

(87) PCT Pub. No.: WO2020/259520
PCT Pub. Date: Dec. 30, 2020

(65) Prior Publication Data
US 2022/0262826 A1 Aug. 18, 2022

(30) Foreign Application Priority Data
Jun. 27, 2019 (CN) .......................... 201910564636.1

(51) Int. Cl.
*H01L 27/12* (2006.01)
*H01L 29/66* (2006.01)

(52) U.S. Cl.
CPC ........ *H01L 27/1222* (2013.01); *H01L 27/127* (2013.01); *H01L 27/1288* (2013.01); *H01L 29/66742* (2013.01)

(58) Field of Classification Search
CPC .............. H01L 27/1222; H01L 27/127; H01L 27/1288; H01L 29/66742
See application file for complete search history.

(56) References Cited

U.S. PATENT DOCUMENTS

| | | | | |
|---|---|---|---|---|
| 2006/0118786 A1* | 6/2006 | Kim | ...................... | H01L 29/458 257/E21.414 |
| 2010/0099205 A1* | 4/2010 | Kim | ........................ | H01L 27/12 438/22 |
| 2011/0133193 A1* | 6/2011 | Song | ................. | H01L 29/78669 257/E21.414 |

FOREIGN PATENT DOCUMENTS

| | | |
|---|---|---|
| CN | 101170086 A | 4/2008 |
| CN | 101625971 A | 1/2010 |

(Continued)

OTHER PUBLICATIONS

Machine English translation of CN 110459474, Xial et al., A manufacturing Method And Display Device of Thin Film Transistor, published Nov. 15, 2019.*

(Continued)

*Primary Examiner* — Peniel M Gumedzoe

(57) ABSTRACT

A method of manufacturing a thin film transistor and a display device are disclosed. The method includes: forming a gate metal layer, a gate insulating layer, an active layer, an ohmic contact layer sequentially on a substrate; producing a photoresist layer on the metal layer where the portion of the photoresist layer at the channel region has a smaller thickness than other portions; a first wet etching in which the metal layer corresponding to the photoresist layer is obtained; a first drying etching in which the active layer and (Continued)

ohmic contact layer corresponding to the photoresist layer are Obtained; a second wet etching in which the portion of the metal layer corresponding to the channel region removed; and a second dry etching in which the portion of the active layer corresponding to the channel region is made to have a smaller thickness than other portions of the active layer.

18 Claims, 5 Drawing Sheets

(56) References Cited

FOREIGN PATENT DOCUMENTS

| | | |
|---|---|---|
| CN | 109830461 A | 5/2019 |
| CN | 110459474 A | 11/2019 |

OTHER PUBLICATIONS

Dong Yan, the ISA written comments, Aug. 2020, CN.
Dong Yan, the International Search Report, Aug. 2020, CN.

\* cited by examiner

METHOD OF MANUFACTURING THIN FILM TRANSISTOR AND DISPLAY DEVICE

CROSS-REFERENCE TO RELATED APPLICATIONS

This application is a United States national stage application of co-pending International Patent Application Number PCT/CN2020/097842, filed Jun. 24, 2020, which claims the priority to and benefit of Chinese patent application CN201910564636.1, entitled "Method of Manufacturing Thin Film Transistor and Display Device" and filed Jun. 27, 2019 with China National Intellectual Property Administration, the entire contents of which are incorporated herein by reference.

TECHNICAL FIELD

This application relates to the field of display technology, and more particularly relates to a method of manufacturing a thin film transistor and a display device.

BACKGROUND

The statements herein are intended for the mere purposes of providing background information related to the present application but don't necessarily constitute prior art.

Thin film transistor (TFT) liquid crystal display (LCD) is a technology that ingeniously combines microelectronics technology and LCD technology, in which TFTs are used as switches for pixels to control the rotation of liquid crystals to present different colors. The production of thin film transistors includes the deposition of various layers of thin films, which mainly include a gate metal, a gate insulating layer, an active layer, an ohmic contact layer, a source and drain metal, a passivation layer, and a pixel electrode. The ohmic contact layer makes a good ohmic contact between the active layer and the metal electrodes, thus reducing the contact resistance between the active layer and the metal layer, and improving the transmission rate of electrons. In addition, the ohmic contact layer also functions as a hole blocking layer. After the active layer material and the second metal layer material are deposited, a half-tone mask can be used to etch the active layer to save the mask manufacturing procedures.

When the photoresist layer is dry-etched, a dry etching gas containing an oxidizing gas may be used, which may cause metal oxides to appear on the upper surface of the second metal layer, resulting in poor subsequent etching and affecting display performance.

SUMMARY

It is therefore one objective of this application to provide a method for manufacturing a thin film transistor and a display device to improve the display performance of the thin film transistor.

In order to achieve the above objective, the present application provides a method for manufacturing a thin film transistor, the method including the following operations:
forming a gate metal layer, a gate insulating layer, an active layer, an ohmic contact layer, and a metal layer sequentially on the substrate, and depositing a photoresist on the metal layer;
using a half-tone mask to form a preset pattern on the photoresist layer, so that the portion of the photoresist layer corresponding to the channel region form a photoresist thin layer with a thickness smaller than other portions of the photoresist layer;
a first wet etching, in which a metal layer corresponding to the photoresist layer of the preset pattern is obtained by etching;
a first dry etching, in which an oxidizing etching gas is used for etching to obtain an active layer and an ohmic contact layer corresponding to the photoresist layer of the preset pattern, and furthermore, the photoresist thin layer is completely etched;
a second wet etching, in which the metal layer in the channel region is etched and removed, and a metal or metal oxide remains;
removing the remaining metal or metal oxide to form a source metal layer and a drain metal layer respectively on both sides of the channel region;
a second dry etching, in which the ohmic contact layer is etched to hollow out the portion of the ohmic contact layer corresponding to the channel region, and meanwhile partially etching the active layer to make the portion of the active layer corresponding to the channel region has a smaller thickness than that of other portions of the active layer; and
forming a passivation layer and a transparent conductive layer sequentially on the source metal layer and the drain metal layer to obtain the thin film transistor.

The application further discloses a method for manufacturing a thin film transistor, the method including the following operations:
providing a substrate;
depositing a gate metal layer material on the substrate, and using a first photomask to form the gate metal layer;
depositing a gate insulating layer, an active layer material, an ohmic contact layer material, and a metal layer material sequentially on the gate metal layer, and depositing a photoresist on the metal layer material to form a photoresist layer;
using a half-tone mask as a second mask to form a predetermined pattern on the photoresist layer, so that the portion of the photoresist layer corresponding to the channel region forms a photoresist thin layer with a thickness smaller than other portions of the photoresist layer;
a first wet etching, in which an acidic etching solution containing nitric acid and acetic acid is used for etching to obtain a metal layer corresponding to the photoresist layer of the preset pattern, and then an alkaline etching solution containing sodium hydroxide is used for etching to remove the metal oxides produced after etching with the acidic etching solution;
a first dry etching, in which a mixed etching gas containing sulfur hexafluoride gas and oxygen is used for etching, and then a mixed etching gas containing sulfur hexafluoride gas and chlorine gas is used for etching to obtain an active layer and an ohmic contact layer corresponding to the photoresist layer of the preset pattern, and meanwhile, the photoresist thin layer is completely etched;
a second wet etching, in which an acidic etching solution containing nitric acid and acetic acid is used to oxidize the metal on the surface of the metal layer in the channel region to a metal oxide, then an alkaline etching solution containing sodium hydroxide is used to etch and remove the metal oxide and the metal layer in the channel region, and a source metal layer and a drain metal layer are formed respectively on both sides of the channel region;

a second dry etching, in which a mixed etching gas of sulfur hexafluoride gas, chlorine, and helium is used to etch the ohmic contact layer to hollow out the portion of the ohmic contact layer corresponding to the channel region, and meanwhile the active layer is partially etched so that the portion of the active layer corresponding to the channel region is smaller than that of other portions of the active layer;

depositing the passivation layer material on the source metal layer and the drain metal layer, and using a third mask to form the passivation layer; and depositing a transparent conductive layer material on the passivation layer, and using a fourth mask to form a transparent conductive layer thus obtaining the thin film transistor;

where the content of the sodium hydroxide in the alkaline etching solution containing sodium hydroxide lies in the range of 5-50%; the content of nitric acid in the acid etching solution containing nitric acid and acetic acid lies in the range of 1-8%, and the content of acetic acid is 20-50% %, and the rest is water.

The application further discloses a display device, which includes a thin film transistor, where the method for manufacturing the thin film transistor includes the following operations:

forming a gate metal layer, a gate insulating layer, an active layer, an ohmic contact layer, and a metal layer sequentially on the substrate, and depositing a photoresist on the metal layer to form a photoresist layer;

using a half-tone mask to form a preset pattern on the photoresist layer, so that the portion of the photoresist layer corresponding to the channel region form a photoresist thin layer with a thickness smaller than other portions of the photoresist layer;

a first wet etching, in which a metal layer corresponding to the photoresist layer of the preset pattern is obtained by etching;

a first dry etching, in which an oxidizing etching gas is used for etching to obtain an active layer and an ohmic contact layer corresponding to the photoresist layer of the preset pattern, and meanwhile, the photoresist thin layer is completely etched;

a second wet etching, in which the metal layer in the channel region is etched and removed, and a metal or metal oxide remains;

removing the remaining metal or metal oxide to form a source metal layer and a drain metal layer respectively on both sides of the channel region;

a second dry etching, in which the ohmic contact layer is etched to hollow out the portion of the ohmic contact layer corresponding to the channel region, and meanwhile partially etching the active layer to make the portion of the active layer corresponding to the channel region has a smaller thickness than that of other portions of the active layer; and forming a passivation layer and a transparent conductive layer sequentially on the source metal layer and the drain metal layer to obtain the thin film transistor.

Compared with the scheme that does not etch away the metal oxide that may appear during the first wet etching and the second wet etching, the etching solution used in this application is not only considered to be able to etch the metal layer, but also to etch and remove the metal oxide in the channel region to prevent the residual metal or metal oxide from affecting the etching of the ohmic contact layer. In this way, it is possible to avoid the influence of metal oxides and their residues on subsequent manufacturing processes without increasing the photomask manufacturing procedures, which is beneficial to improve product performance, increase yield, and is suitable for large-scale use.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

DETAILED DESCRIPTION OF EMBODIMENTS

Figure 1:
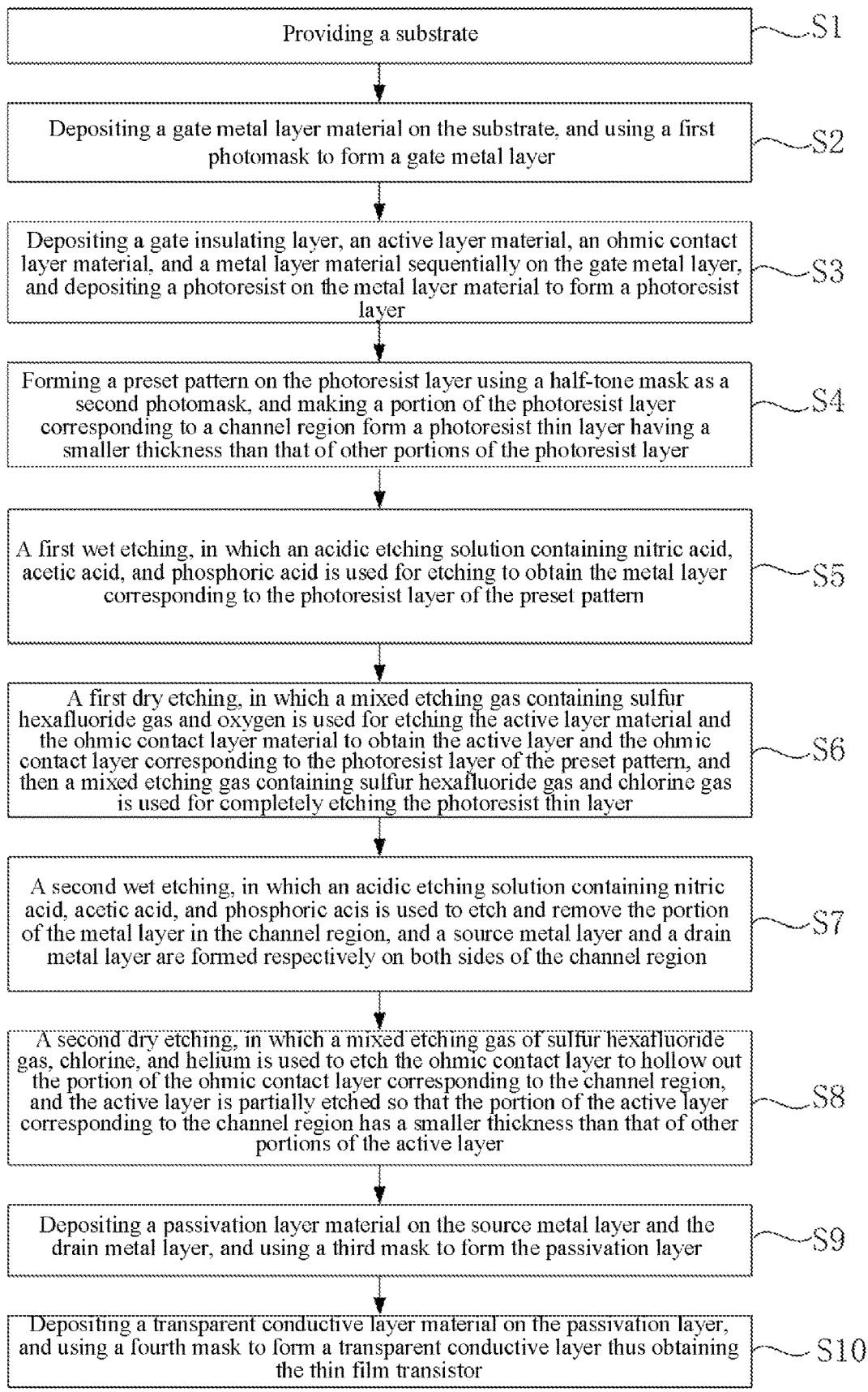
FIG. 1 shows a flowchart illustrating a method of manufacturing a thin film transistor in an exemplary technology.

It is to be noted that the specific structures and functional details disclosed herein are merely representative and are intended for mere purposes of illustrating some exemplary embodiments of the present application. However, this application may be implemented in many alternative forms and should not be construed as being limited to the embodiments set forth herein.

As used herein, terms "center", "transverse", "up", "down", "left", "right", "vertical", "horizontal", "top", "bottom", "inside", "outside", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure. In addition, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. As used herein, the term "multiple" or "a plurality of" means two or more, unless otherwise specified. The terms "comprise", "comprising", "include", "including", and any variations thereof are intended to mean non-exclusive inclusion.

Furthermore, as used herein, terms "installed on", "mounted on", "connected to", "coupled to", "connected with", and "coupled with" should be understood in a broad sense unless otherwise specified and defined. For example, they may indicate a fixed connection, a detachable connection, or an integral connection. They may denote a mechanical connection, or an electrical connection. They may denote a direct connection, a connection through an intermediate, or an internal connection between two elements. For those of ordinary skill in the art, the specific meanings of the above terms as used in the present application can be understood depending on specific contexts.

The terminology used here is intended for mere purposes of illustrating specific embodiments and is not intended to limit the exemplary embodiments. Unless the context clearly dictates otherwise, the singular forms "a" and "one" used herein are also intended to include the plural. It should also be understood that the terms "including" and/or "comprising" used herein specify the existence of the stated features, integers, steps, operations, units and/or components, and do not exclude the existence or addition of one or more other features, integers, steps, operations, units, components, and/ or combinations thereof.

The present application will be described in further detail below in conjunction with the drawings and embodiments.

Specifically, after the metal layer and the ohmic contact layer are successively deposited using the half-tone mask technology, the functional film and the conductive film are etched by two wet etching and two dry etching procedures. Because the half-tone mask exposure process is adopted, it is rendered difficult to control the thickness of the portion of the photoresist layer in the channel region of the thin film transistor. If the photoresist layer is too thin, metal residues will be produced during subsequent etching, and further residues of the ohmic contact layer will be produced, causing local short circuits and severely affecting display performance. Of course, it is also possible to use more or less photomasks to manufacture the thin film transistor.

Figure 2:
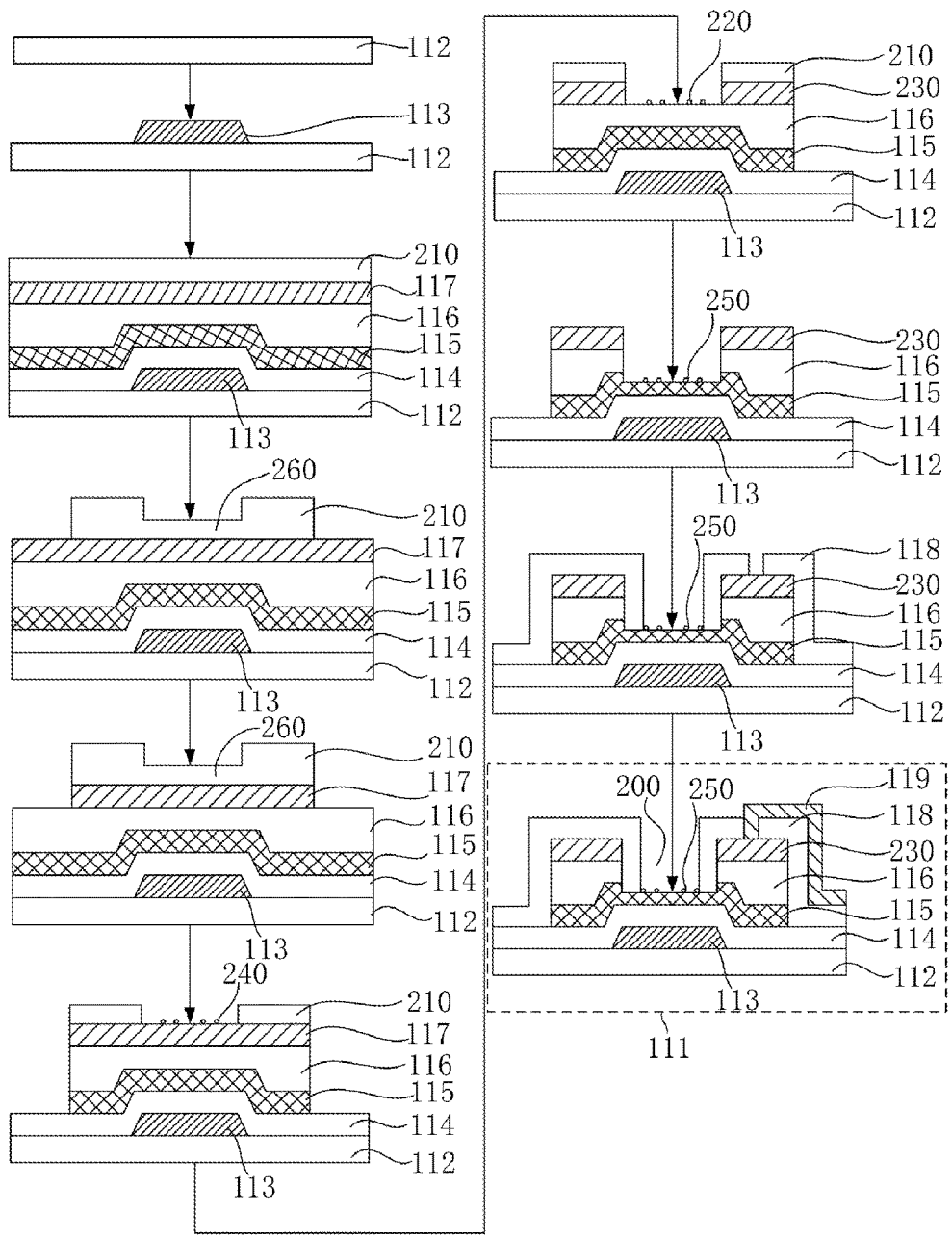
FIG. 2 shows a schematic diagram illustrating the production of the thin film transistor as shown in FIG. 1.

As illustrated in FIG. 1 and FIG. 2, the manufacturing process of the thin film transistor of the exemplary technology includes the following operations:

S1: providing a substrate;

S2: depositing a gate metal layer material on the substrate, and using a first photomask to form the gate metal layer;

S3: depositing a gate insulating layer, an active layer material, an ohmic contact layer material, and a metal layer material sequentially on the gate metal layer, and depositing a photoresist on the metal layer material to form a photoresist layer;

S4: using a half-tone mask as a second mask to form a predetermined pattern on the photoresist layer, so that the portion of the photoresist layer corresponding to the channel region forms a photoresist thin layer with a thickness smaller than other portions of the photoresist layer;

S5: a first wet etching, in which a metal layer corresponding to the photoresist layer of the preset pattern is obtained by etching;

S6: a first dry etching, in which a mixed etching gas containing sulfur hexafluoride gas and oxygen is used for etching the active layer material and the ohmic contact layer material to obtain an active layer and an ohmic contact layer corresponding to the photoresist layer of the preset pattern, and meanwhile, the photoresist thin layer is completely etched using a mixed etching gas containing sulfur hexafluoride gas and chlorine gas;

S7: a second wet etching, in which an acidic etching solution containing nitric acid, acetic acid, and phosphoric acid is used to etch and remove the portion of the metal layer in the channel region to form source and drain metal layers respectively on both sides of the channel region;

S8: a second dry etching, in which a mixed etching gas of sulfur hexafluoride gas, chlorine, and helium is used to etch the ohmic contact layer to hollow out the portion of the ohmic contact layer corresponding to the channel region, and meanwhile the active layer is partially etched so that the portion of the active layer corresponding to the channel region is smaller than that of other portions of the active layer;

S9: depositing the passivation layer material on the source metal layer and the drain metal layer, and using a third mask to form the passivation layer; and S10: depositing a transparent conductive layer material on the passivation layer, and using a fourth mask to form a transparent conductive layer thus obtaining the thin film transistor;

The oxygen used in the first dry etching can easily oxidize the surface of the metal layer 117 into a metal oxide 240. In the subsequent second wet etching, the mixed acidic etching solution has a slower etching rate of the metal oxide 240 on the surface of the metal layer 117, resulting in incomplete etching of the metal layer 117, so that there will be metal layer residue 220. Then in the second dry etching, the metal layer residue 220 will be etched away, but the ohmic contact layer residue 250 will be produced, which will affect the display performance.

Figure 3:
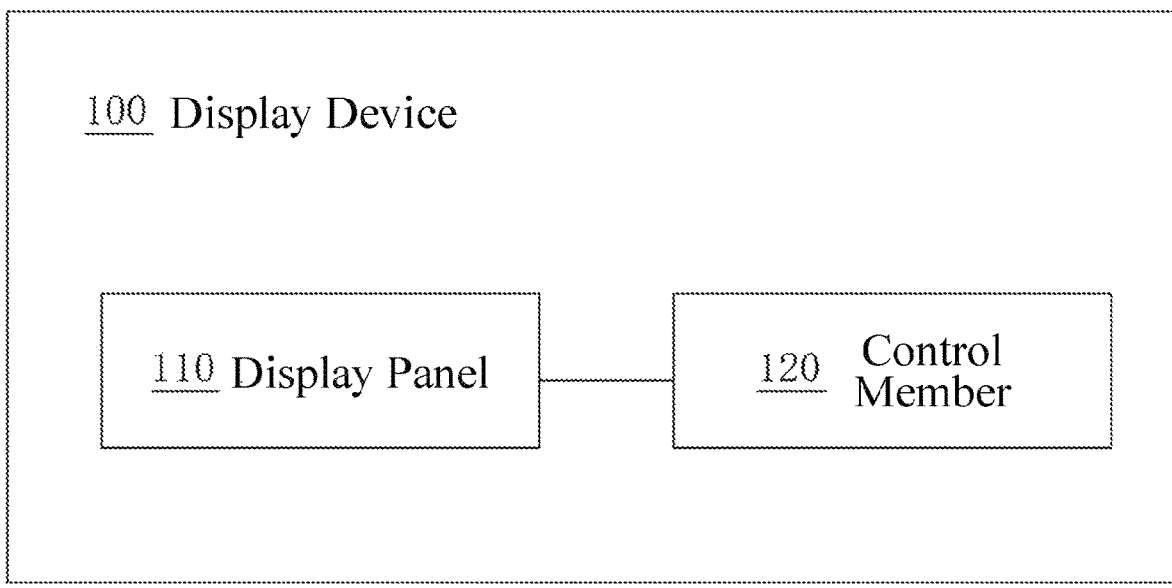
FIG. 3 shows a schematic diagram of a display device according to the present application.
Figure 4:
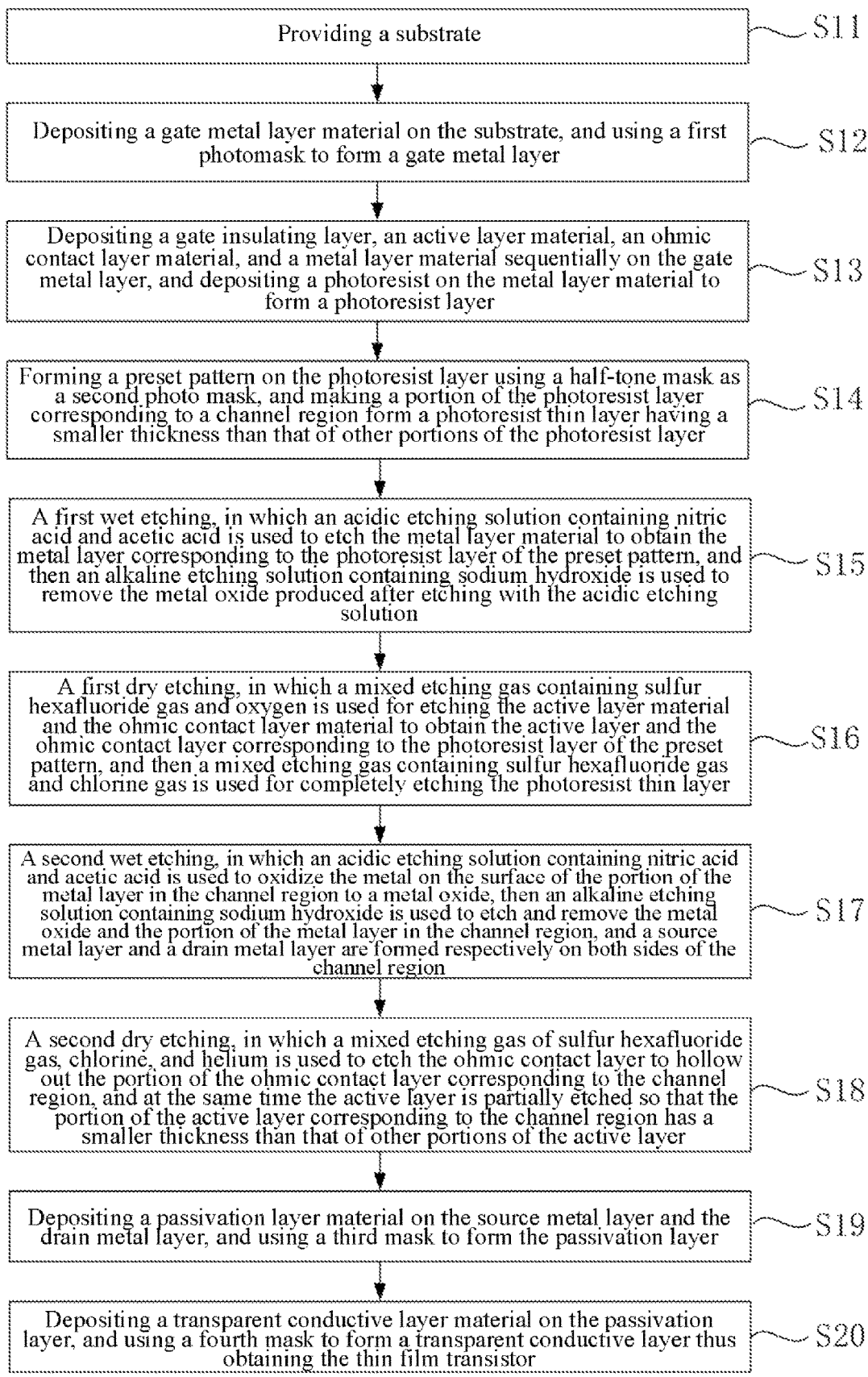
FIG. 4 shows a flowchart of a method of manufacturing a thin film transistor according to the present application.
Figure 5:
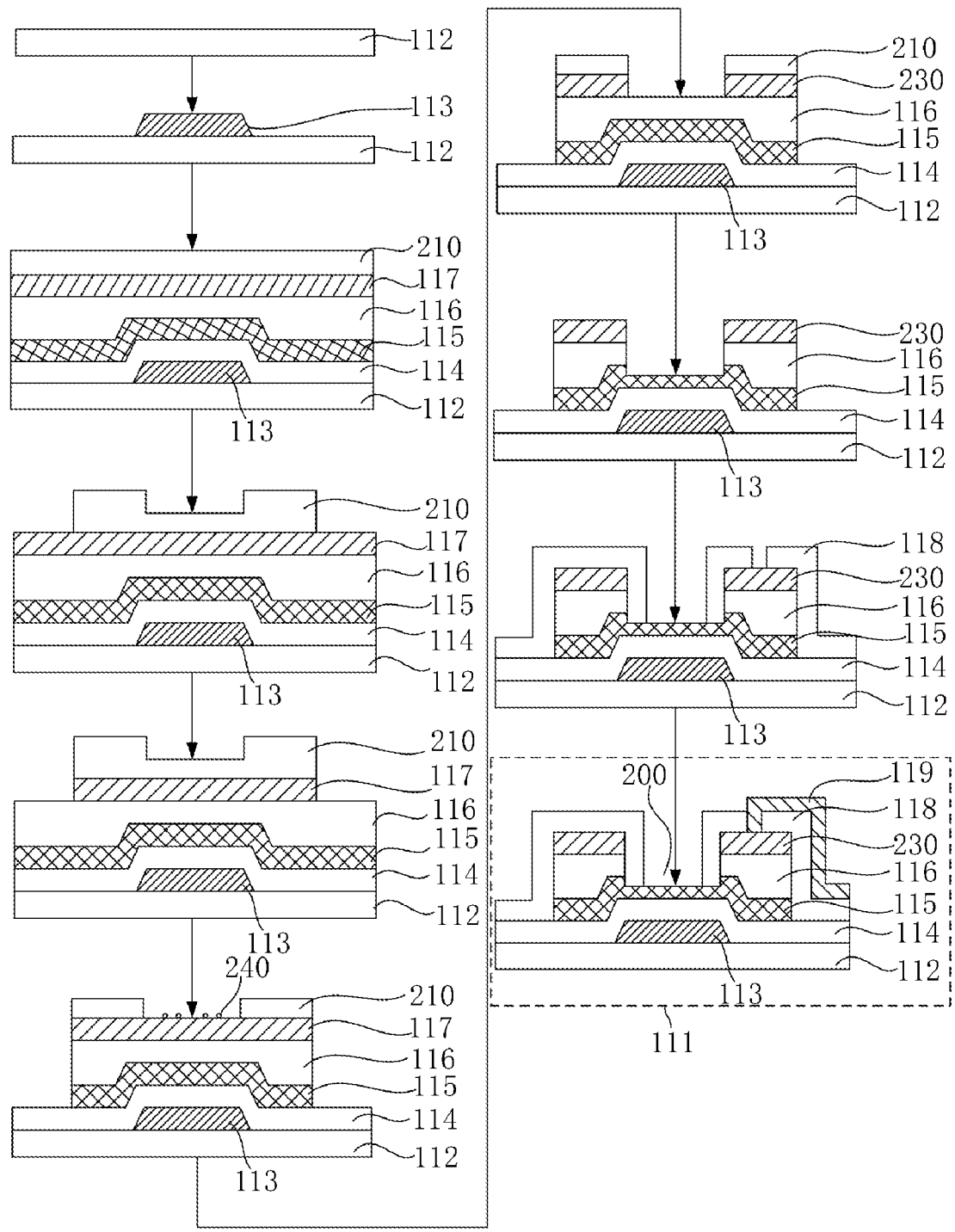
FIG. 5 shows a schematic diagram illustrating the production of the thin film transistor as shown in FIG. 4.

As illustrated in FIGS. 3 to 5, the present application discloses a display device 100, which includes a display panel 110 and a control member 120, where the control component 120 is connected to the display panel 110 and is configured to control the display panel 110. The display panel 110 includes a thin film transistor 111, which includes a substrate 112, a gate metal layer 113, a gate insulating layer 114, an active layer 115, an ohmic contact layer 116, a source and drain metal layer 230, a passivation layer 118, and a transparent conductive layer 119. The gate metal layer 113 is disposed on the substrate 112. The gate insulating layer 114 is disposed on the gate metal layer 113. The active layer 115 is disposed on the gate insulating layer 114. The ohmic contact layer 116 is disposed on the active layer 115. The source and drain metal layer 230 is disposed on the ohmic contact layer 116. The passivation layer 118 is disposed on the source and drain metal layer 230. The transparent conductive layer 119 is disposed on the passivation layer 118.

As illustrated in FIG. 4 and FIG. 5, the manufacturing method of the thin film transistor includes the following operations:

S11: providing a substrate;

S12: depositing a gate metal layer material on the substrate, and using a first photomask to form the gate metal layer;

S13: depositing a gate insulating layer, an active layer material, an ohmic contact layer material, and a metal layer material sequentially on the gate metal layer, and depositing a photoresist on the metal layer material to form a photoresist layer;

S14: using a half-tone mask as a second mask to form a predetermined pattern on the photoresist layer, so that the portion of the photoresist layer corresponding to the channel region forms a photoresist thin layer with a thickness smaller than other portions of the photoresist layer;

S15, a first wet etching, in which an acidic etching solution containing nitric acid and acetic acid is used for etching to obtain a metal layer corresponding to the photoresist layer of the preset pattern, and then an alkaline etching solution containing sodium hydroxide is used for etching to remove the metal oxides produced after etching with the acidic etching solution;

S16: a first dry etching, in which a mixed etching gas containing sulfur hexafluoride gas and oxygen is used for etching the active layer material and the ohmic contact layer material to obtain an active layer and an ohmic contact layer corresponding to the photoresist layer of the preset pattern, and meanwhile, the photoresist thin layer is completely etched using a mixed etching gas containing sulfur hexafluoride gas and chlorine gas;

S17, a second wet etching, in which an acidic etching solution containing nitric acid and acetic acid is used to oxidize the metal on the surface of the metal layer in the channel region to a metal oxide, then an alkaline etching solution containing sodium hydroxide is used to etch and remove the metal oxide and the metal layer in the channel region, and a source metal layer and a drain metal layer are formed respectively on both sides of the channel region;

S18: a second dry etching, in which a mixed etching gas of sulfur hexafluoride gas, chlorine, and helium is used to etch the ohmic contact layer to hollow out the portion of the ohmic contact layer corresponding to the channel region, and meanwhile the active layer is partially etched so that the portion of the active layer corresponding to the channel region is smaller than that of other portions of the active layer;

S19: depositing the passivation layer material on the source metal layer and the drain metal layer, and using a third mask to form the passivation layer; and S20: depositing a transparent conductive layer material on the passivation layer, and using a fourth mask to form a transparent conductive layer thus obtaining the thin film transistor;

The content (weight ratio) of the sodium hydroxide in the alkaline etching solution containing sodium hydroxide lies in the range of 5-50%; the content (weight ratio) of nitric acid in the acid etching solution containing nitric acid and acetic acid lies in the range of 1-8%, and the content of acetic acid is 20-50% %, and the rest is water, e.g., the proportion of water may be 42%-79%.

Compared with the scheme that does not etch away the metal oxide 240 that may appear during the first wet etching and the second wet etching, the etching solution used in this scheme is not only considered to be able to etch the metal layer 117, but also to etch and remove the metal oxide 240 in the channel region 200 to prevent the residual metal or metal oxide 240 from affecting the etching of the ohmic contact layer 116. In this way, it is possible to avoid the influence of metal oxides 240 and their residues on subsequent manufacturing processes without increasing the photomask manufacturing procedures, which is beneficial to improve product performance, increase yield, and is suitable for large-scale use.

When depositing the metal layer material, if it is left for a long time or the metal material used is problematic, metal oxide may appear. The wet etching solution used in this application takes into account both the etching of the metal and the etching of the metal oxide, which can achieve good etching effect, and can avoid the adverse effects of residues on subsequent processes.

Specifically, this solution uses a two-step etching method to solve the residue problem. That is, an acidic solution is first used, in which the oxidizing nitric acid oxidizes the metal of the metal layer 117 to a high-valent metal oxide 240, while the weakly acidic acetic acid can provide steady hydrogen ions to adjust the pH of the solution. As such, the nitric acid of a low concentration can reduce the peeling of the photoresist layer 210, and meanwhile, it can control the etching rate and oxidize the upper layer metal to the high-valent metal oxide 240. Then, the metal oxide 240 on the surface layer and the metal in the middle are etched with an alkaline etching solution containing sodium hydroxide, which can solve the residual problem of the ohmic contact layer 116 without affecting the etching of the metal in the channel region 200.

Of course, the oxidizing acid may alternatively or additionally be one of perchloric acid, hypochlorous acid, potassium permanganate, chlorous acid, etc.; the weak acid may alternatively or additionally be one of oxalic acid, carbonic acid, etc.; and the lye in the alkaline etching solution may alternatively or additionally be potassium hydroxide, barium hydroxide, lithium hydroxide, etc., all of which are applicable.

More specifically, the metal layer 117 may be etched by taking the three layers of molybdenum, aluminum and molybdenum as an example, and the chemical reaction formulas for removing metal or metal oxide residues by an alkaline etching solution are as follows: $MoO_3+NaOH=Na_2MoO_4+H_2O$, $Al+NaOH+H_2O=NaAlO_2+H_2$. The products created by the reaction of the etching solution in this scheme can be conveniently cleaning and do not affect the display effect of the thin film transistor.

The oxidizing acid is implemented as nitric acid as an example, and the weak acid is implemented as acetic acid as an example. The composition ratios and etching rates of the corresponding etching solutions are shown in Table 1 below.

TABLE 1

Etching solution composition and etching rate table

| No. | Nitric acid | Acetic acid | water | Rate (A/s) |
|---|---|---|---|---|
| 1 | 1 | 20 | 79 | 26 |
| 2 | 1 | 30 | 69 | 32 |
| 3 | 1 | 50 | 49 | 35 |
| 4 | 3 | 20 | 77 | 38 |
| 5 | 3 | 30 | 67 | 45 |
| 6 | 3 | 50 | 47 | 48 |
| 7 | 6 | 20 | 74 | 44 |
| 8 | 6 | 30 | 64 | 50 |
| 9 | 6 | 50 | 44 | 53 |
| 10 | 8 | 20 | 72 | 47 |
| 11 | 8 | 30 | 62 | 51 |
| 12 | 8 | 50 | 42 | 54 |

Ingredients (%)(weight ratio)

Because if the content of oxidizing acid in the etching solution is too high it will peel off the photoresist and affect the equipment, the concentration of the oxidizing acid (nitric acid) in this solution is 2%-6% under the condition of meeting the actual production cycle requirements.

It should be noted that the limitations of various operations involved in this application will not be deemed to limit the order of the operations, provided that they do not affect the implementation of the specific application, so that the operations written earlier may be executed earlier or they may also be executed later or even meanwhile. As long as the application can be implemented, they should all be regarded as falling in the scope of protection of this application.

This application relates to a thin film transistor of a display panel, where the display panel may be a twisted nematic (TN) panel, a vertical alignment (VA) panel, or a multi-domain vertical alignment (Multi-domain Vertical Alignment, MVA) panel. Of course, other types of panels are also possible, as long as they are applicable.

The foregoing description is merely a further detailed description of the present application made with reference to some specific illustrative embodiments, and the specific implementations of the present application will not be construed to be limited to these illustrative embodiments. For those having ordinary skill in the technical field to which this application pertains, numerous simple deductions or substitutions may be made without departing from the concept of this application, which shall all be regarded as falling in the scope of protection of this application.

What is claimed is:

1. A method of manufacturing a thin film transistor, the method comprising:
    forming a gate metal layer, a gate insulating layer, an active layer, an ohmic contact layer, and a metal layer sequentially on a substrate, and depositing a photoresist on the metal layer to form a photoresist layer;
    forming a preset pattern on the photoresist layer using a half-tone mask, and making a portion of the photoresist layer corresponding to a channel region form a photoresist thin layer having a smaller thickness than that of other portions of the photoresist layer;
    a first wet etching, in which the metal layer is etched to obtain a patterned metal layer corresponding to the photoresist layer of the preset pattern;
    a first dry etching, in which an oxidizing etching gas is used for etching the active layer and the ohmic contact layer to obtain a patterned active layer and a patterned ohmic contact layer corresponding to the photoresist layer of the preset pattern, and in which the photoresist thin layer is completely etched;
    a second wet etching, in which a portion of the patterned metal layer in the channel region is etched and removed, and a metal or metal oxide residue is remained;
    removing the remaining metal or metal oxide residue to form a source metal layer and a drain metal layer respectively on two sides of the channel region;
    a second dry etching, in which the patterned ohmic contact layer is etched to hollow out a portion of the patterned ohmic contact layer corresponding to the channel region, and partially etching the patterned active layer to make a portion of the patterned active layer corresponding to the channel region have a smaller thickness than that of other portions of the patterned active layer; and
    forming a passivation layer and a transparent conductive layer sequentially on the source metal layer and the drain metal layer to obtain the thin film transistor.

2. The method as recited in claim 1, wherein in the second wet etching operation in which the portion of the patterned metal layer in the channel region is etched and removed and a metal or metal oxide residue is remained, an acidic etching solution is configured to oxidize a surface metal of the portion of the patterned metal layer in the channel region into a metal oxide;
    and wherein in the operation of removing the remaining metal or metal oxide residue to form the source metal layer and the drain metal layer respectively on the two sides of the channel region, an alkaline etching solution is configured to etch and remove the metal oxide and the portion of the patterned metal layer in the channel region.

3. The method as recited in claim 2, wherein the acidic etching solution comprises 1%-8% of an oxidizing acid, 20%-50% of a weak acid, and water.

4. The method as recited in claim 3, wherein the proportion of water lies in the range of 42%-79%.

5. The method as recited in claim 3, wherein the oxidizing acid comprises perchloric acid, hypochlorous acid, potassium permanganate, chlorous acid, or nitric acid.

6. The method as recited in claim 5, wherein the weak acid comprises oxalic acid, carbonic acid, or acetic acid.

7. The method as recited in claim 6, wherein the oxidizing acid is nitric acid, and the weak acid is acetic acid.

8. The method as recited in claim 7, wherein the concentration of the nitric acid lies in the range of 2% and 6%.

9. The method as recited in claim 2, wherein a lye in the alkaline etching solution comprises potassium hydroxide, barium hydroxide, lithium hydroxide, or sodium hydroxide.

10. The method as recited in claim 9, wherein the alkaline etching solution is sodium hydroxide solution.

11. The method as recited in claim 10, wherein the concentration of sodium hydroxide in the alkaline etching solution lies in the range of 5%-50%.

12. The method as recited in claim 1, wherein the first wet etching operation in which the metal layer is etched to obtain a patterned metal layer corresponding to the photoresist layer of the preset pattern comprises:
    first using an acidic etching solution containing an oxidizing acid and a weak acid for etching the metal layer to obtain the patterned metal layer corresponding to the photoresist layer of the preset pattern, and then using an alkaline etching solution containing sodium hydroxide configured to remove the metal oxide produced after etching by the acidic etching solution.

13. The method as recited in claim 1, wherein the second wet etching operation in which the portion of the patterned metal layer in the channel region is etched and removed and a metal or metal oxide residue is remained, and the operation of removing the remaining metal or metal oxide residue to form the source metal layer and the drain metal layer respectively on the two sides of the channel region comprise:
    first using an acidic etching solution containing an oxidizing acid and a weak acid to oxidize the metal on the surface of the portion of the patterned metal layer in the channel region into a metal oxide, then using an alkaline etching solution containing sodium hydroxide to etch and remove the metal oxide and the portion of the patterned metal layer in the channel region; and forming the source metal layer and the drain metal layer respectively on the two sides of the channel region.

14. The method as recited in claim 1, wherein the first wet etching operation in which the metal layer is etched to obtain a patterned metal layer corresponding to the photoresist layer of the preset pattern comprises:
    using an acidic etching solution containing nitric acid, acetic acid, and phosphoric acid for etching the metal layer to obtain the patterned metal layer corresponding to the photoresist layer of the preset pattern.

15. The method as recited in claim 1, wherein the second wet etching operation in which the portion of the patterned metal layer in the channel region is etched and removed and the metal or metal oxide residue is remained, and the operation of removing the remaining metal or metal oxide residue to form the source metal layer and the drain metal layer respectively on the two sides of the channel region comprise:

using an acidic etching solution containing nitric acid, acetic acid, and phosphoric acid to etch and remove the portion of the patterned metal layer in the channel region to form the source and drain metal layers respectively on the two sides of the channel region.

16. The method as recited in claim 1, wherein the first dry etching and the second dry etching each use an etching gas, wherein the first dry etching uses a mixed gas of sulfur hexafluoride gas, chlorine gas, and oxygen, and wherein the second dry etching uses a mixed gas of sulfur hexafluoride gas, chlorine gas, and helium.

17. The method as recited in claim 1, wherein the metal layer is a three-layer structure of molybdenum, aluminum, and molybdenum.

18. A method of manufacturing a thin film transistor, the method comprising:

providing a substrate;

depositing a gate metal layer material on the substrate, and using a first photomask to form a gate metal layer;

depositing a gate insulating layer, an active layer material, an ohmic contact layer material, and a metal layer material sequentially on the gate metal layer, and depositing a photoresist on the metal layer material to form a photoresist layer;

forming a preset pattern on the photoresist layer using a half-tone mask, and making a portion of the photoresist layer corresponding to a channel region form a photoresist thin layer having a smaller thickness than that of other portions of the photoresist layer;

a first wet etching, in which an acidic etching solution containing nitric acid and acetic acid is used for etching the metal layer material to obtain a metal layer corresponding to the photoresist layer of the preset pattern, and then an alkaline etching solution containing sodium hydroxide is configured to remove a metal oxide produced after etching with the acidic etching solution;

a first dry etching, in which a mixed etching gas containing sulfur hexafluoride gas and oxygen is used for etching, and then a mixed etching gas containing sulfur hexafluoride gas and chlorine gas is used for etching the active layer material and the ohmic contact layer material to obtain an active layer and an ohmic contact layer corresponding to the photoresist layer of the preset pattern, and the photoresist thin layer is completely etched;

a second wet etching, in which an acidic etching solution containing nitric acid and acetic acid is configured to oxidize a metal on a surface of a portion of the metal layer in the channel region to a metal oxide, then an alkaline etching solution containing sodium hydroxide is configured to etch and remove the metal oxide and the portion of the metal layer in the channel region, and a source metal layer and a drain metal layer are formed respectively on two sides of the channel region;

a second dry etching, in which a mixed etching gas of sulfur hexafluoride gas, chlorine, and helium is configured to etch the ohmic contact layer to hollow out a portion of the ohmic contact layer corresponding to the channel region, and the active layer is partially etched so that a portion of the active layer corresponding to the channel region has a smaller thickness than that of other portions of the active layer;

depositing a passivation layer material on the source metal layer and the drain metal layer, and using a third mask to form a passivation layer; and depositing a transparent conductive layer material on the passivation layer, and using a fourth mask to form a transparent conductive layer thus obtaining the thin film transistor;

where a content of the sodium hydroxide in the alkaline etching solution containing sodium hydroxide lies in a range of 5%-50%; a content of nitric acid in the acid etching solution containing nitric acid and acetic acid lies in a range of 1%-8%, and a content of acetic acid is 20%-50%%, and the rest is water.

* * * * *